US008922237B2

(12) United States Patent
Ku (10) Patent No.: US 8,922,237 B2
(45) Date of Patent: Dec. 30, 2014

(54) SEMICONDUCTOR INTEGRATED CIRCUIT WITH TESTING AND REPAIRING VIA (75) Inventor: Young Jun Ku, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 210 days.

(21) Appl. No.: 13/604,519

(22) Filed: Sep. 5, 2012

(65) Prior Publication Data

US 2013/0207685 A1 Aug. 15, 2013

(30) Foreign Application Priority Data

Feb. 14, 2012 (KR) ........................ 10-2012-0014856

(51) Int. Cl.
G01R 31/02 (2006.01)

(52) U.S. Cl.
USPC ................. 324/762.01; 324/750.01

(58) Field of Classification Search
CPC ............ G01R 31/2853; G01R 31/318513; G01R 31/31717; H01L 22/22; H01L 23/481; H01L 2924/0002; H01L 2924/00012
See application file for complete search history.

(56) References Cited

U.S. PATENT DOCUMENTS

| 2011/0102011 | A1* | 5/2011 | Van Der Plas et al. | .. 324/762.03 |
| 2012/0007624 | A1* | 1/2012 | Byeon et al. | ............ 324/750.15 |
| 2013/0021079 | A1* | 1/2013 | Jeong | ............ 327/286 |
| 2013/0092936 | A1* | 4/2013 | Yang et al. | ............ 257/48 |
| 2013/0093454 | A1* | 4/2013 | Lai et al. | ............ 324/762.01 |

* cited by examiner

Primary Examiner — Minh N Tang
(74) Attorney, Agent, or Firm — William Park & Associates Patent Ltd.

(57) ABSTRACT

A semiconductor integrated circuit includes a plurality of semiconductor chips coupled to one another through vias, wherein a lowermost semiconductor chip of the plurality of semiconductor chips is configured to generate a first test pulse signal and transmit the first test pulse signal through the via, an uppermost semiconductor chip of the plurality of semiconductor chips is configured to generate a second test pulse signal while substantially maintaining a time difference with the first test pulse signal, and to transmit the second test pulse signal through the via, and the plurality of semiconductor chips are configured to generate test result signals for determining whether the vias are defective in response to the first test pulse signal and the second test pulse signal.

25 Claims, 8 Drawing Sheets

SEMICONDUCTOR INTEGRATED CIRCUIT WITH TESTING AND REPAIRING VIA

CROSS-REFERENCES TO RELATED APPLICATION

The present application claims priority under 35 U.S.C. §119(a) to Korean application number 10-2012-0014856, filed on Feb. 14, 2012, in the Korean Intellectual Property Office, which is incorporated herein by reference in its entirety as set forth in full.

BACKGROUND

1. Technical Field

The present invention generally relates to a semiconductor circuit, and more particularly, to a semiconductor integrated circuit.

2. Related Art

Semiconductor integrated circuits are fabricated by stacking a plurality of chips in order to improve the degree of integration.

As one of them, research into a via, for example, a through-silicon via (TSV) semiconductor integrated circuit has been actively conducted.

According to such a method, the plurality of chips are stacked and through-silicon vias are formed, so that all the chips are coupled to one another.

In the semiconductor integrated circuit using the through-silicon vias, various defects may occur in a fabrication process. That is, there may occur defects such as void indicating that conductive material is not filled in the through-silicon via, bump contact fail due to the bending of a chip or the movement of bump material, or crack occurring in the through-silicon via.

When such defects occur, the transferring of various signals or the supply of power may not be performed among chips, resulting in a serious operation error in the semiconductor integrated circuit.

In this regard, it is necessary to perform a repair operation according to a test for determining the occurrence of such defects and results of the test.

In a conventional art, a method has been used to check a test signal output to the outside of a semiconductor integrated circuit by using an external apparatus, and to cut a repair fuse.

However, since the semiconductor integrated circuit includes a plurality of through-silicon vias, it is necessary to observe the vias is or store a series of data by using the external apparatus and to use a repair program and the like, in order to test the occurrence of defects in the vias and repair the defects.

Therefore, in the semiconductor integrated circuit according to the conventional art, a test time and test-related data are increased, test efficiency is reduced due to the limitation of available channels and a memory of a test equipment, and a time for performing a repair operation is additionally necessary, resulting in a reduction in a fabrication yield of the semiconductor integrated circuit.

SUMMARY

A semiconductor integrated circuit capable of reducing test and repair times is described herein.

In an embodiment, a semiconductor integrated circuit includes a plurality of semiconductor chips coupled to one another through vias, wherein a lowermost semiconductor chip of the plurality of semiconductor chips is configured to generate a first test pulse signal and transmit the first test pulse signal through the via, an uppermost semiconductor chip of the plurality of semiconductor chips is configured to generate a second test pulse signal while substantially maintaining a time difference with the first test pulse signal, and to transmit the second test pulse signal through the via, and the plurality of semiconductor chips are configured to generate test result signals for determining whether the vias are defective in is response to the first test pulse signal and the second test pulse signal.

In an embodiment, a semiconductor integrated circuit includes a plurality of semiconductor chips coupled to one another through vias, wherein a lowermost semiconductor chip of the plurality of semiconductor chips is configured to generate a first test pulse signal and transmit the first test pulse signal through the via, an uppermost semiconductor chip of the plurality of semiconductor chips is configured to generate a second test pulse signal while substantially maintaining a time difference with the first test pulse signal, and to transmit the second test pulse signal through the via, the plurality of semiconductor chips are configured to generate test result signals for determining whether the vias are defective in response to the first test pulse signal and the second test pulse signal, and to change signal paths, which are coupled to defective vias, to repair vias in response to the test result signals.

In a semiconductor integrated circuit according to an embodiment, test and repair times are reduced, resulting in the improvement of a fabrication yield.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described in detail with reference to the accompanying drawings through various embodiments.

First, a semiconductor integrated circuit according to an embodiment is summarized in that self-test and repair is possible.

Figure 1:
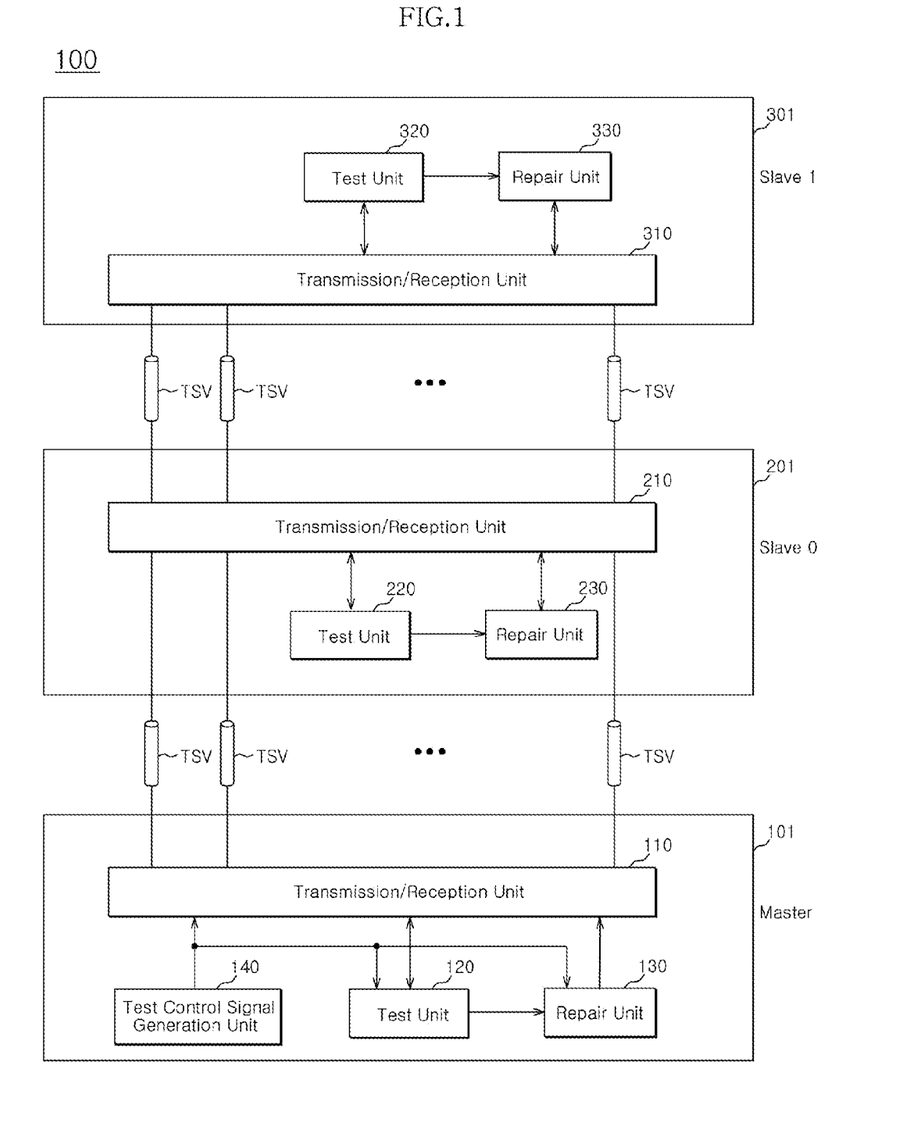
FIG. 1 is a block diagram of a semiconductor integrated circuit 100 according to an embodiment.

As illustrated in FIG. 1, a semiconductor integrated circuit 100 according to an embodiment may be configured by stacking a plurality of chips, that is, a master 101, a slave 0 (201), and a slave 1 (301).

The master 101, the slave 0 (201), and the slave 1 (301) may be coupled to one another through a plurality of through-silicon vias (TSV) (hereinafter, referred to as vias).

The plurality of vias may be classified into normal vias, repair vias, and dedicated vias according to the purpose thereof.

The normal vias may be used to transmit normal operation-related signals, for example, commands, data, addresses and the like.

The repair vias may be used to substitute for normal vias when defects occur in the normal vias.

The dedicated vias may be used to transmit separate signals including test control signals.

The master 101 may include a transmission/reception unit 110, a test unit 120, a repair unit 130, and a test control signal generation unit 140.

The transmission/reception unit 110 may be configured to perform a signal transmission/reception operation between the master 101 and another chip, that is, the slave 0 (201).

The test unit 120 may be configured to perform a test operation by communicating with other chips through the transmission/reception unit 110 by using the test control signals.

The test operation is for testing the occurrence of defects in the vias.

The repair unit 130 may be configured to perform a repair operation in response to results of the test.

The repair operation may change a signal is transmission/reception path of the transmission/reception unit 110.

The test control signal generation unit 140 may be configured to generate a plurality of test control signals having predetermined timings.

The slave 0(201) may include a transmission/reception unit 210, a test unit 220, and a repair unit 230.

The transmission/reception unit 210 may be configured to perform a signal transmission/reception operation between the slave 0(201) and other chips, that is, the master 101 and the slave 1 (301).

The test unit 220 may be configured to perform a test operation by communicating with the transmission/reception unit 210 by using test control signals.

The test operation is for testing the occurrence of defects in the vias.

The repair unit 230 may be configured to perform a repair operation in response to results of the test performed by the test unit 220.

The repair operation may change a signal transmission path of the transmission/reception unit 210.

The slave 1(301) may include a transmission/reception unit 310, a test unit 320, and a repair unit 330.

The transmission/reception unit 310 may be configured to perform a signal transmission/reception operation between the slave 1(301) and another chip, that is, the slave 0 (201).

The test unit 320 may be configured to perform a test operation by communicating with the transmission/reception unit 310 by using test control signals.

The test operation is for testing the occurrence of defects in the vias.

The repair unit 330 may be configured to perform a repair operation in response to results of the test performed by the test unit 320.

The repair operation may change a signal transmission path of the transmission/reception unit 310.

Configurations of the master 101, the slave 0 (201), and the slave 1 (301) will be described with reference to the accompanying drawings.

Figure 2:
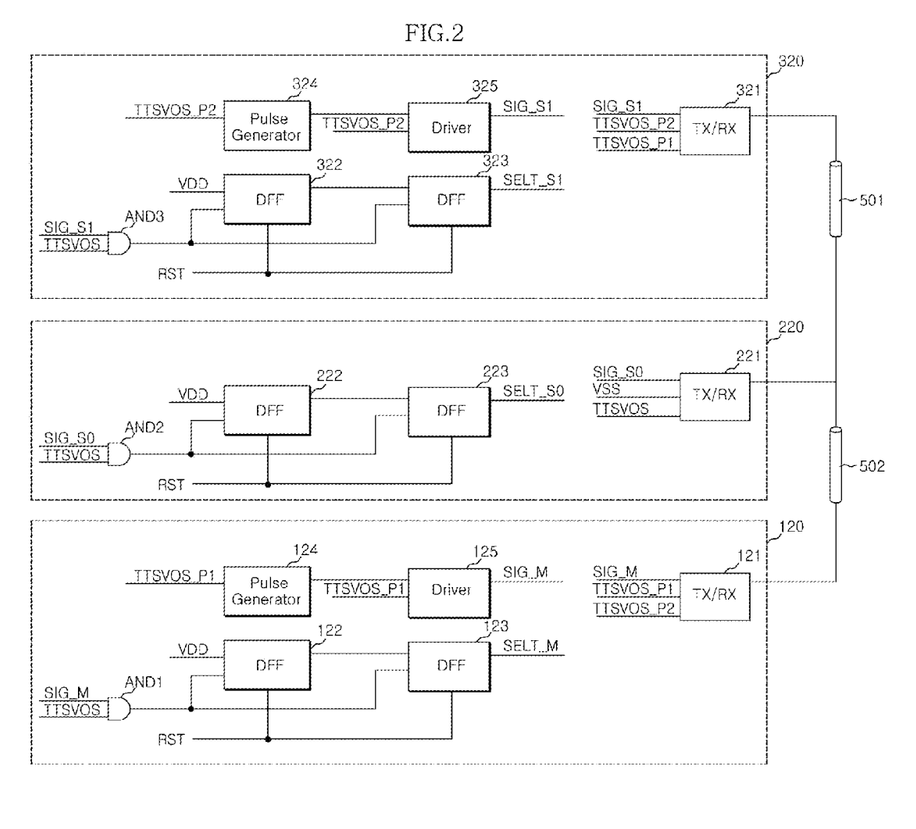
FIG. 2 is a block diagram illustrating the configurations of test units 120, 220, and 320 of FIG. 1.

With reference to FIG. 2, the configurations of the test units 120, 220, and 320 of FIG. 1 will be described. At this time, FIG. 2 illustrates a partial circuit configuration corresponding to one via in the entire circuit configuration of the test units 120, 220, and 320.

The test unit 120 of the master may include an AND gate AND1, a shift logic having flip-flops (DFFs) 122 and 123, a pulse generator 124, a driver 125, and a transmitter/receiver (TX/RX) 121.

The AND gate AND1 may be configured to perform an AND operation on a test pulse signal SIG_M and a test control signal TTSVOS, and to provide a resultant signal as a clock signal of the flip-flops (DFFs) 122 and 123. The flip-flops (DFFs) 122 and 123 are is initialized in response to a reset signal RST.

The shift logic, that is, the flip-flops (DFFs) 122 and 123 may be configured to sequentially shift a logic high signal, that is, the level of a power supply voltage VDD in response to the output of the AND gate AND1, and to generate a test result signal SELT_M. That is, when the test pulse signal SIG_M may be generated twice, the flip-flops (DFFs) 122 and 123 activate the test result signal SELT_M.

The pulse generator 124 may be configured to generate a pulse in response to a test control signal TTSVOS_P1.

The driver 125 may be configured to drive the output of the pulse generator 124 in response to the test control signal TTSVOS_P1, and to generate the test pulse signal SIG_M.

The transmitter/receiver 121 may be configured to transmit the test pulse signal SIG_M output from the driver 125 to a via 502 through its own transmission function that is activated during an activation duration of the test control signal TTSVOS_P1.

The transmitter/receiver 121 may be configured to receive a signal, which is transmitted through the via 502, as the test pulse signal SIG_M through its own reception function that is activated during an activation duration of a test control signal TTSVOS_P2.

The test unit 220 of the slave 0 may include an AND gate AND2, flip-flops (DFFs) 222 and 223, and a transmitter/receiver (TX/RX) 221.

The AND gate AND2 may be configured to perform an AND operation on a test pulse signal SIG_S0 and the test control signal TTSVOS, and to provide a resultant signal as a clock signal of the flip-flops (DFFs) 222 and 223 The flip-flops (DFFs) 222 and 223 are initialized in response to a reset signal RST.

The flip-flops (DFFs) 222 and 223 may be configured to sequentially shift the logic high signal, that is, the level of the power supply voltage VDD in response to the output of the AND gate AND2, and to generate a test result signal SELT_S0. That is, when the test pulse signal SIG_S0 may be generated twice, the flip-flops (DFFs) 222 and 223 activate the test result signal SELT_S0.

The transmitter/receiver 221 may be configured to receive signals, which are transmitted through vias 501 and 502, as the test pulse signal SIG_S0 through its own reception function that is activated during an activation duration of the test control signal TTSVOS.

The test unit 320 of the slave 1 may include an AND gate AND3, a shift logic having flip-flops (DFFs) 322 and 323, a pulse generator 324, a driver 325, and a transmitter/receiver (TX/RX) 321.

The AND gate AND3 may be configured to perform an AND operation on a test pulse signal SIG_1 and the test control signal TTSVOS, and to provide a resultant signal as a clock signal of the flip-flops (DFFs) 322 and 323. The flip-flops (DFFs) 322 and 323 are initialized in response to a reset signal RST.

The shift logic, that is, the flip-flops (DFFs) 322 and 323 may be configured to sequentially shift the logic high signal, that is, the level of the power supply voltage VDD in response to the output of the AND gate AND3, and to generate a test result signal SELT_S1. That is, when the test pulse signal SIG_S1 may be generated twice, the flip-flops (DFFs) 322 and 323 activate the test result signal SELT_S1.

The pulse generator 324 may be configured to generate a pulse in response to the test control signal TTSVOS_P2.

The driver 325 may be configured to drive the output of the pulse generator 324 in response to the test control signal TTSVOS_P2, and to generate the test pulse signal SIG_S1.

The transmitter/receiver 321 may be configured to transmit the test pulse signal SIG_S1 output from the driver 325 to the via 501 through its own transmission function that is activated during an activation duration of the test control signal TTSVOS_P2.

The transmitter/receiver 321 may be configured to receive a signal, which is transmitted through the via 501, as the test pulse signal SIG_S1 through its own reception function that is activated during an activation duration of the test control signal TTSVOS_P1.

With reference to FIG. 2 and FIGS. 3 to 5, the test operation according to an embodiment will be described.

Figure 3:
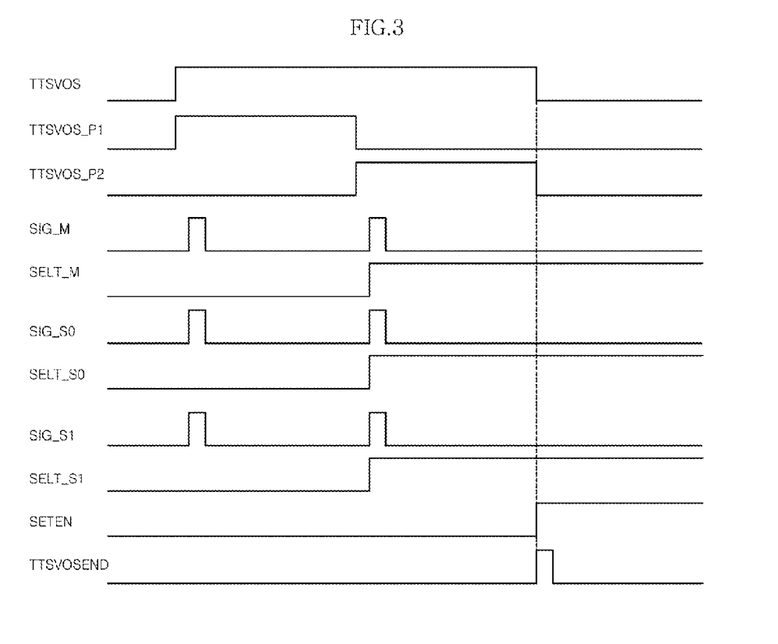
FIGS. 3 to 5 are waveform diagrams of test control signals of a semiconductor integrated circuit 100 according to an embodiment.

As illustrated in FIG. 3, the test control signals include a plurality of signals classified into TTSVOS, TTSVOS_P1, TTSVOS_P2, SETEN, and TTSVOSEND.

The signal TTSVOS defines a test duration.

The signal TTSVOS_P1 has an activation duration corresponding to a first half of an entire activation duration of the signal TTSVOS.

The signal TTSVOS_P2 has an activation duration corresponding to a second half of the entire activation duration of the signal TTSVOS.

The signal SETEN is activated after the activation duration of the signal TTSVOS ends.

The signal TTSVOSEND is a pulse signal generated at the time point at which the activation duration of the signal TTSVOS ends.

Hereinafter, a test operation when no defect occurs in the vias will be described with reference to FIG. 2 and FIG. 3.

The test unit 120 of the master may be configured to generate the test pulse signal SIG_M in response to the signal TTSVOS_P1.

Since the transmission function of the test unit 120 is activated for the activation duration of the signal TTSVOS_P1, the test unit 120 may transmit the test pulse signal SIG_M to the via 502.

The test pulse signal SIG_M may be transferred to the test unit 220 of the slave 0 through the via 502, and may be transferred to the test unit 320 of the slave 1 through the via 501.

The test unit 320 may generate the test pulse signal SIG_S1 in response to the signal TTSVOS_P2.

Since the transmission function of the test unit 320 is activated for the activation duration of the signal TTSVOS_P2, the test unit 320 may transmit the test pulse signal SIG_S1 to the via 501.

The test pulse signal SIG_S1 may be transferred to the test unit 220 through the via 501, and may be transferred to the test unit 120 through the via 502.

Since the reception function of the test unit 120 is activated for the activation duration of the signal TTSVOS_P2, the test unit 120 may receive the test pulse signal SIG_S1 as the test pulse signal SIG_M.

As a consequence, the test unit 120 may activate the test result signal SELT_M in response to the test pulse signal SIG_M generated twice by the test unit 120 and received from an exterior for the activation duration of the signal TTSVOS.

At this time, activation of the test result signal SELT defines that all the vias are normal.

The test unit 220 may receive the test pulse signal SIG_M and the test pulse signal SIG_S1, which may be received for the activation duration of the signal TTSVOS, as the test pulse signal SIG_S0.

Since the test pulse signal SIG_S0 may be generated twice for the activation duration of the signal TTSVOS, the test unit 220 activates the test result signal SELT_S0 in response to the second test pulse signal SIG_S0.

The test unit 320 may also activate the test result signal SELT_S1 in response to the test pulse signal SIG_S1 generated twice by the test unit 320 and received from an exterior for the activation duration of the signal TTSVOS.

Figure 4:
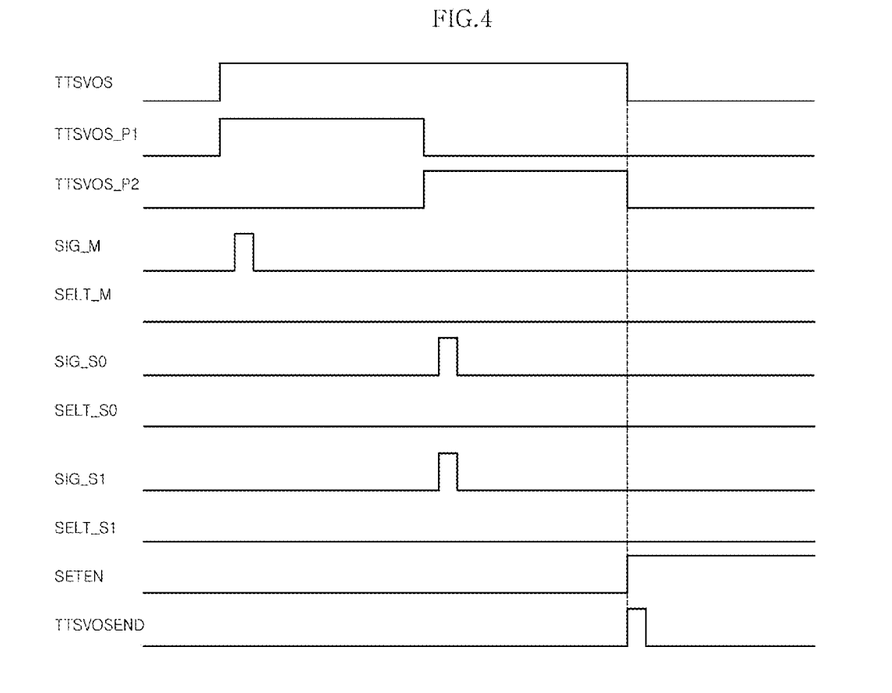

Next, a test operation when the via 502 between the master and the slave 0 is defective will be described with reference to FIG. 2 and FIG. 4.

The test unit 120 of the master may be configured to generate the test pulse signal SIG_M in response to the signal TTSVOS_P1.

Since the transmission function of the test unit 120 is activated for the activation duration of the signal TTSVOS_P1, the test unit 120 may transmit the test pulse signal SIG_M to the via 502.

However, since the via 502 is defective, the test pulse signal SIG_M may not be transferred to the test unit 220 of the slave 0 and the test unit 320 of the slave 1.

Therefore, for the activation duration of the signal TTSVOS_P1, the test pulse signals SIG_S1 and SIG_S0 may not be to generated.

Meanwhile, the test unit 320 may generate the test pulse signal SIG_S1 in response to the signal TTSVOS_P2.

Since the transmission function of the test unit 320 is activated for the activation duration of the signal TTSVOS_P2, the test unit 320 may transmit the test pulse signal SIG_S1 to the via 501.

The test pulse signal SIG_S1 may be transferred to the test unit 220 through the via 501, but is not transferred to the test unit 120.

Therefore, the test pulse signal SIG_M may not be generated for the activation duration of the signal TTSVOS_P2.

As a consequence, since the test pulse signal SIG_M may be generated only once for the activation duration of the signal TTSVOS, the test unit 120 does not active the test result signal SELT_M.

Since the test pulse signal SIG_S0 may be generated only once for the activation duration of the signal TTSVOS, the test unit 220 does not active the test result signal SELT_S0.

Since the test pulse signal SIG_S1 may be generated only once for the activation duration of the signal TTSVOS, the test unit 320 does not active the test result signal SELT_S1.

Figure 5:
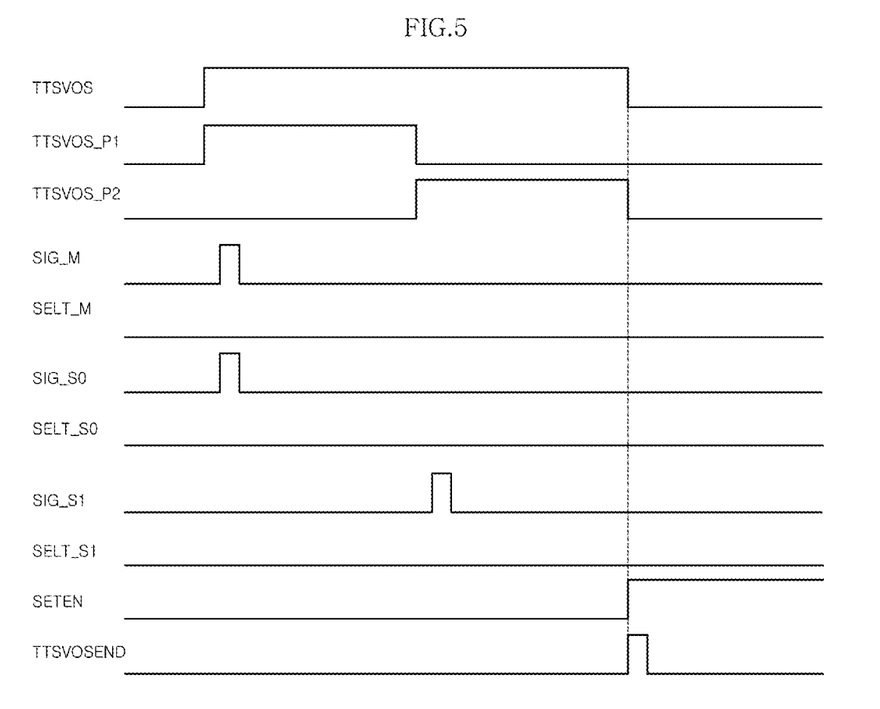

Next, a test operation when the via 501 between the slave 0 and the slave 1 is defective will be described with reference to FIG. 2 and FIG. 5.

The test unit 120 of the master may be configured to generate the test pulse signal SIG_M in response to the signal TTSVOS_P1.

Since the transmission function of the test unit 120 is activated for the activation duration of the signal TTSVOS_P1, the test unit 120 may transmit the test pulse signal SIG_M to the via 502.

The test pulse signal SIG_M may be transferred to the test unit 220 of the slave 0.

However, since the via 501 is defective, the test pulse signal SIG_M may not be transferred to the test unit 320 of the slave 1.

Therefore, for the activation duration of the signal TTSVOS_P1, the test pulse signals SIG_S1 may not be generated.

Meanwhile, the test unit 320 may generate the test pulse signal SIG_S1 in response to the signal TTSVOS_P2.

Since the transmission function of the test unit 320 is activated for the activation duration of the signal TTSVOS_P2, the test unit 320 may transmit the test pulse signal SIG_S1 to the via 501.

However, since the via 501 is defective, the test pulse signal SIG_S1 may not be transferred to the test units 220 and 120.

Therefore, the test pulse signals SIG_M and SIG_S0 may not be generated for the activation duration of the signal TTSVOS_P2.

As a consequence, since the test pulse signal SIG_M may be generated only once for the activation duration of the signal TTSVOS, the test unit 120 does not active the test result signal SELT_M.

Since the test pulse signal SIG_S0 may be generated only once for the activation duration of the signal TTSVOS, the test unit 220 does not active the test result signal SELT_S0.

Since the test pulse signal SIG_S1 may be generated only once for the activation duration of the signal TTSVOS, the test unit 320 does not active the test result signal SELT_S1.

In the configuration of FIG. 2, among all the slaves, a test unit of the uppermost slave has a configuration different from those of test units of the other slaves. Furthermore, the test unit of the uppermost slave may have a configuration substantially the same as that of the test unit of the master.

Figure 6:
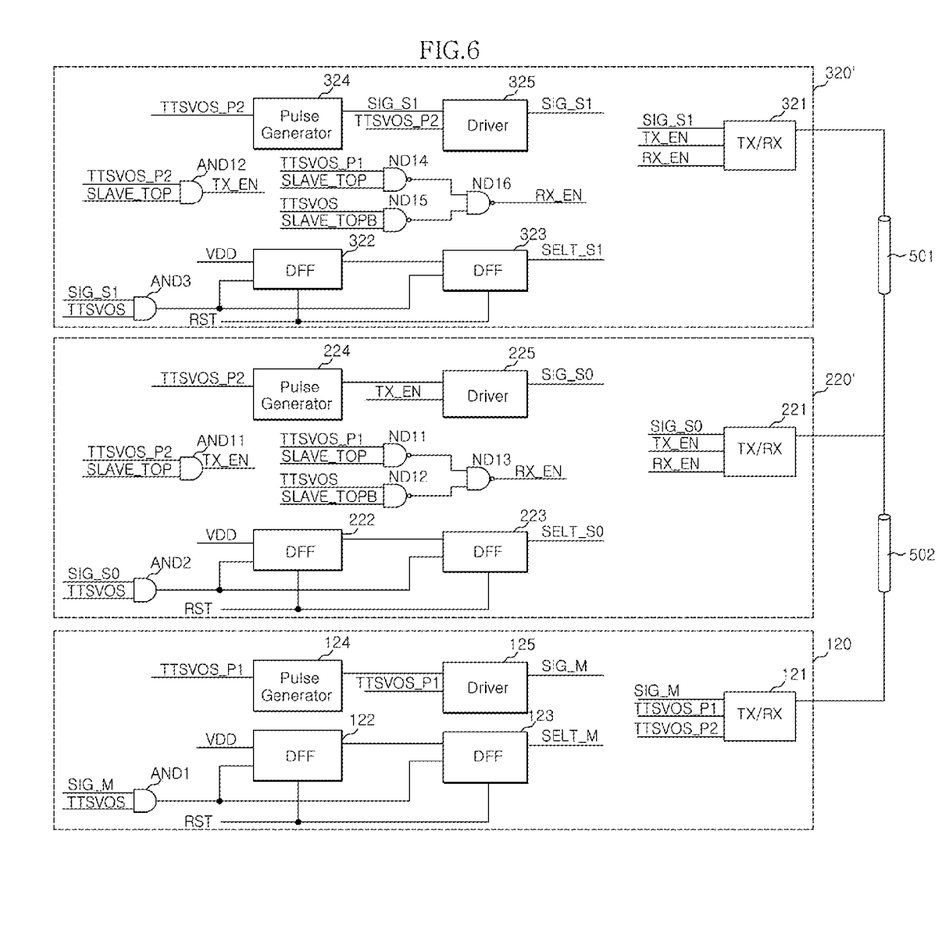
FIG. 6 is a block diagram illustrating another example of the configurations of test units 120, 220, and 320 of FIG. 1.

In this regard, FIG. 6 illustrates an embodiment in which the configurations of the test units of all the slaves are substantially equal to one another.

A test unit 120 may have a configuration substantially the same as that of FIG. 2.

A test unit 220' may have a configuration substantially the same as that of the test unit 220 of FIG. 2, except for added logic gates AND11, and ND11 to ND13.

The AND gate AND11 may be configured to combine a signal TTSVOS_P2 with a signal SLAVE_TOP and generate a transmission enable signal TX_EN.

The signal SLAVE_TOP is activated only for the uppermost slave.

That is, the signal TTSVOS_P2 is combined with the signal SLAVE_TOP through the AND gate AND11, so that only the uppermost slave is allowed to perform transmission and the other slaves are allowed to perform only reception.

The NAND gates ND11 to ND13 may be configured to perform a NAND operation on a signal TTSVOS_P1 and the signal SLAVE_TOP, perform a NAND operation on a signal TTSVOS with the signal SLAVE_TOPB, perform a NAND operation on results of the NAND operations, and generate a reception enable signal RX_EN.

That is, using the NAND gates ND11 to ND13, the other slaves, other than the uppermost slave, may be allowed to perform reception for the activation duration of the signal TTSVOS, and the uppermost slave is allowed to perform reception only for the activation duration of the signal TTSVOS_P1.

Consequently, since the test unit 220' is not provided in the uppermost slave, the signal SLAVE_TOP is deactivated, so that reception is possible for the activation duration of the signal TTSVOS.

A test unit 320' may have a configuration substantially the same as that of the test unit 320 of FIG. 2, except for added logic gates AND12, and ND14 to ND16.

The AND gate AND12 may be configured to combine the signal TTSVOS_P2 with the signal SLAVE_TOP and generate the transmission enable signal TX_EN.

That is, the signal TTSVOS_P2 may be combined with the signal SLAVE_TOP through the AND gate AND12, so that only the is uppermost slave is allowed to perform transmission and the other slaves are allowed to perform only reception.

The NAND gates ND14 to ND16 may be configured to perform a NAND operation on the signal TTSVOS_P1 and the signal SLAVE_TOP, perform a NAND operation on the signal TTSVOS with the signal SLAVE_TOPB, perform a NAND operation on results of the NAND operations, and generate the reception enable signal RX_EN.

That is, using the NAND gates ND14 to ND16, the other slaves, other than the uppermost slave, may be allowed to perform reception for the activation duration of the signal TTSVOS, and the uppermost slave is allowed to perform reception only for the activation duration of the signal TTSVOS_P1.

Consequently, since the test unit 320' is not provided in the uppermost slave, the signal SLAVE_TOP is deactivated, so that reception is possible for the activation duration of the signal TTSVOS_P1 and transmission is possible for the activation duration of the signal TTSVOS_P2.

Figure 7:
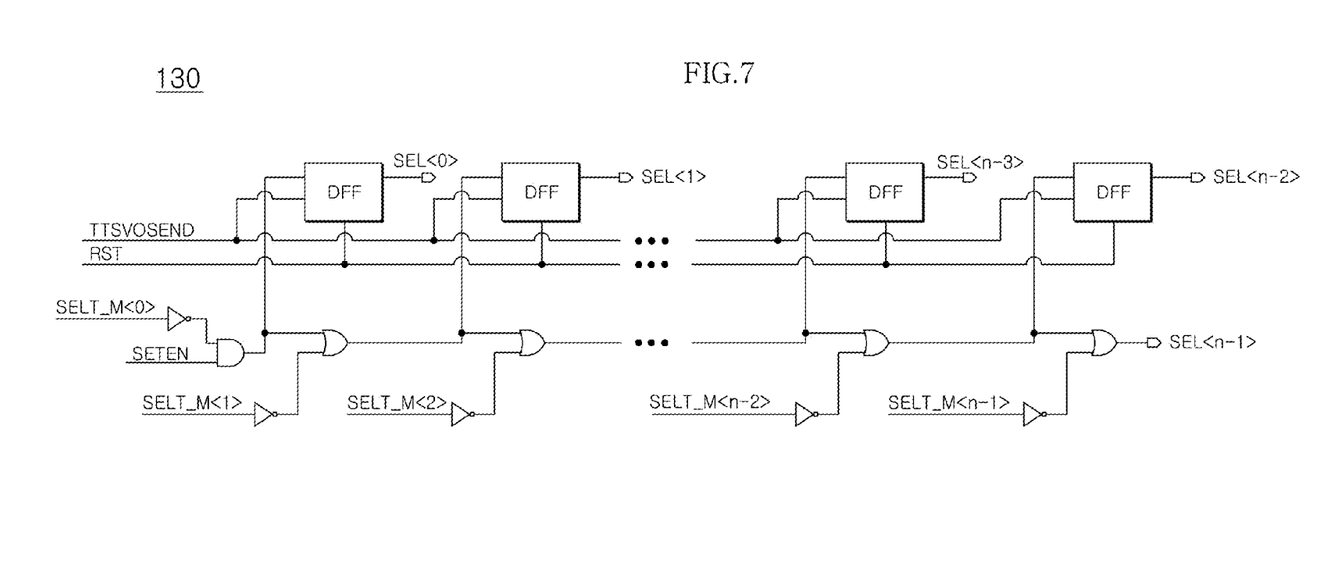
FIG. 7 is a circuit diagram illustrating the configuration of a repair unit 130 of FIG. 1.

As illustrated in FIG. 7, the repair unit 130 of the master may be configured to replace defective vias with repair vias by using selection signals SEL<0:n−1> generated in response to the test control signals, that is, the signal TTSVOSEND and the signal SETEN, and test result signals SELT<0:n−1>.

The repair unit 130 may include a plurality of flip-flops DFFs and a plurality of logic gates.

The plurality of flip-flops DFFs may be configured to receive the signal TTSVOSEND as a clock signal, and activate the selection signals SEL<0:n−1> subsequent to deactivated signals of the test result signals SELT<0:n−1>, respectively.

Furthermore, the repair units 230 and 330 of FIG. 1 may have configurations substantially the same as that of the repair unit 130.

Figure 8:
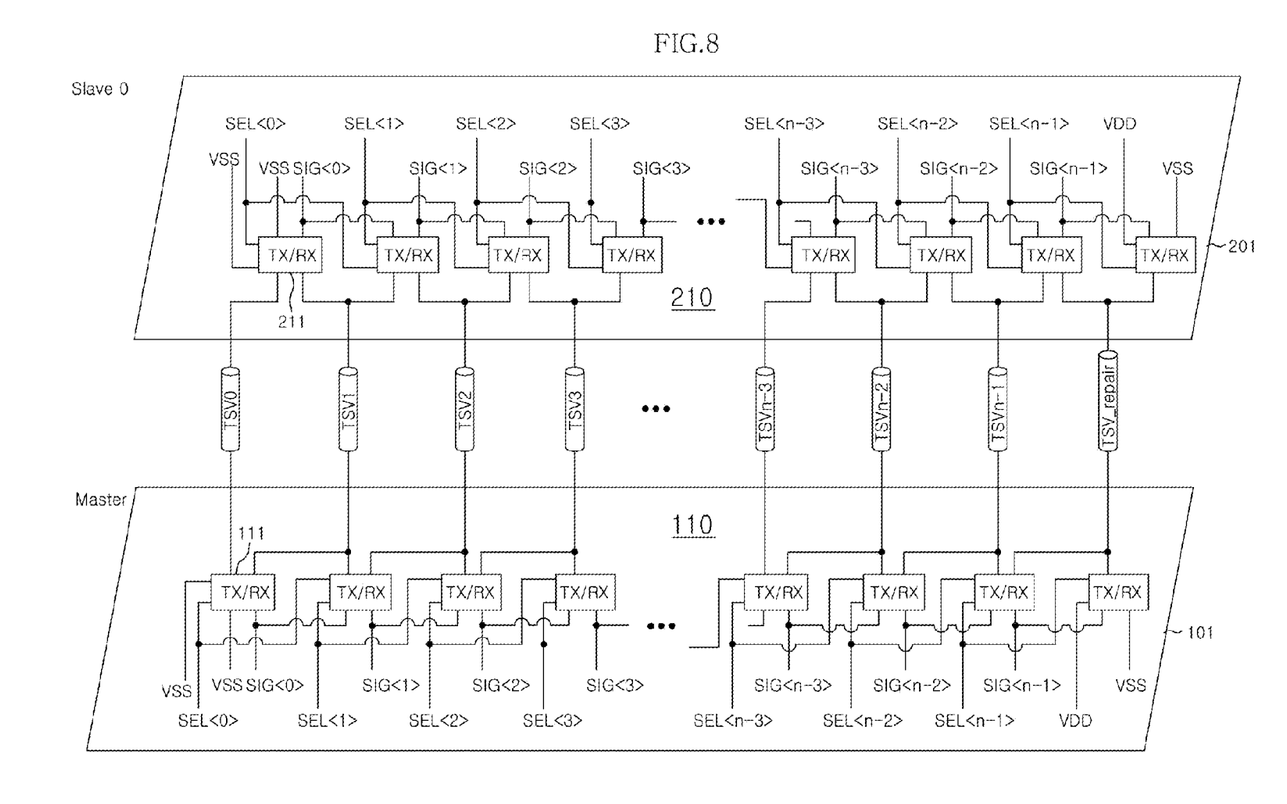
FIG. 8 is a diagram illustrating a connection relation between transmission/reception units 110 and 120 and through-silicon vias of FIG. 1.

With reference to FIG. 8, a description will be provided for repair methods of the transmission/reception unit 110 of the master 101 the transmission/reception unit 210 of the slave 0(201) in FIG. 1.

Referring to FIG. 8, among a plurality of vias TSV0 to TSVn−1 and TSV_repair, the vias TSV0 to TSVn−1 are normal vias, the TSV_repair is a repair via, and a dedicated via for transmitting a test control signal and a selection signal is omitted.

The transmission/reception unit 110 of the master 101 may include a plurality of transmitters/receivers TX/RX.

The plurality of transmitters/receivers TX/RX may be configured to multiplex transmission paths and reception paths, respectively.

For example, when the vias TSV0 to TSVn−1 are normal in a test result, the plurality of transmitters/receivers TX/RX may be basically set to receive signals SIG<0:n−1> corresponding to their own orders (for the purpose of convenience, increase from the left side and the right side of FIG. 8) in response to the selection signals SEL<0:n−1>. At this time, the repair via TSV_repair is not used.

For example, when the first via TSV0 is defective in the test result, a shift method may be used to sequentially allocate the signals SIG<0:n−1> to the other vias TSV1 to TSVn−1 except for the defective via.

The plurality of transmitters/receivers TX/RX may be coupled to a plurality of signal lines for transmitting the signals SIG<0:n−1> and the plurality of vias TSV0 to TSVn−1 and TSV_repair in order to cope with the aforementioned shift method.

For example, a transmitter/receiver 111 is coupled to signal lines for transmitting a plurality of signals SIG<0> and SIG<1>, is coupled to a plurality of vias TSV0 and TSV1, and receives the selection signals SEL<0:1> as control signals for signal selection.

A transmitter/receiver 211 is also coupled to signal lines for transmitting a plurality of signals SIG<0> and SIG<1>, is coupled to a plurality of vias TSV1 and TSV2, and may receive the selection signals SEL<0:1> as control signals for signal selection.

The other transmitters/receivers TX/RX may be coupled to signal lines and vias in the same manner as that of the transmitter/receiver 111.

Thus, when the via TSV0 is defective, the master may transmit the signals SIG<0:n−1>, which are to be transmitted through the vias TSV0 to TSVn−1, to the slave 0 through the shifted vias TSV1 to TSVn−1 and TSV_repair.

That is, when the via TSV0 is defective, the transmitter/receiver 111 selects the signal SIG<0> according to the selection signals SEL<0:1> and may transmit the signal SIG<0> to the salve 0(201) through the via TSV1.

The transmission/reception unit 210 of the salve 0(201) may have a configuration substantially the same as that of the transmission/reception unit 110 of the master 101.

Furthermore, the transmission/reception unit 310 (not illustrated) of the salve 1(301) may have a configuration substantially the same as that of the transmission/reception unit 110 of the master 101.

While various embodiments have been described above, it will be understood to those skilled in the art that the embodiments described are by way of example only. Accordingly, the semiconductor integrated circuit described herein should not be limited based on the described embodiments.

What is claimed is:

1. A semiconductor integrated circuit including a plurality of semiconductor chips coupled to one another through vias, wherein a lowermost semiconductor chip of the plurality of semiconductor chips is configured to generate a first test pulse signal and transmit the first test pulse signal through the via,
an uppermost semiconductor chip of the plurality of semiconductor chips is configured to generate a second test pulse signal while substantially maintaining a time difference with the first test pulse signal, and to transmit the second test pulse signal through the via, and
the plurality of semiconductor chips are configured to receive the first test pulse signal and the second test pulse signal and generate test result signals for determining whether the vias are defective in is response to the first test pulse signal and the second test pulse signal.

2. The semiconductor integrated circuit according to claim 1, wherein the lowermost semiconductor chip comprises:
a transmission/reception unit configured to transmit an internal signal to the via or receive a signal transmitted through the via; and
a test unit configured to generate the first test pulse signal at a first timing, and generate the test result signal in response to the first test pulse signal and the second test pulse signal.

3. The semiconductor integrated circuit according to claim 1, wherein the lowermost semiconductor chip further comprises:
a test control signal generation unit configured to generate first to third test control signals for controlling generation timings of the first test pulse signal and the test result signal.

4. The semiconductor integrated circuit according to claim 3, wherein the test unit comprises:
a shift logic configured to receive the first test pulse signal and the second test pulse signal as a clock signal for an activation duration of the first test control signal, shift a level of a power supply voltage, and activate the test result signal;
a pulse generator configured to generate the first test pulse signal in response to the second test control signal; and
a transmitter/receiver configured to transmit the first test pulse signal to the via for an activation duration of the second test control signal, and receive the second test pulse signal from the via for an activation duration of the third test control signal.

5. The semiconductor integrated circuit according to claim 4, wherein the shift logic comprises:
A first flip-flop and a second flip-flop configured for sequentially shifting a level of the power supply voltage.

6. The semiconductor integrated circuit according to claim 3, wherein the uppermost semiconductor chip comprises:
a transmission/reception unit configured to transmit an internal signal to the via or receive a signal transmitted through the via; and
a test unit configured to generate the second test pulse signal at a second timing, and generate the test result signal in response to the first test pulse signal and the second test pulse signal.

7. The semiconductor integrated circuit according to claim 6, wherein the test unit comprises:
a shift logic configured to receive the first test pulse signal and the second test pulse signal as a clock signal for an activation duration of the first test control signal, shift a level of a power supply voltage, and activate the test result signal;
a pulse generator configured to generate the second test pulse signal in response to the third test control signal; and
a transmitter/receiver configured to receive the first test pulse signal from the via for an activation duration of the second test control signal, and transmit the second test pulse signal to the via for an activation duration of the third test control signal.

8. The semiconductor integrated circuit according to claim 7, wherein the shift logic comprises:
A first flip-flop and a second flip-flop configured for sequentially shifting a level of the power supply voltage.

9. The semiconductor integrated circuit according to claim 3, wherein each of remaining semiconductor chips, except for the lowermost semiconductor chip and the uppermost semiconductor chip, comprises:
a transmission/reception unit configured to transmit an internal signal to the via or receive a signal transmitted through the via; and
a test unit configured to generate the test result signal in response to the first test pulse signal and the second test pulse signal.

10. The semiconductor integrated circuit according to claim 9, is wherein the test unit comprises:
a shift logic configured to receive the first test pulse signal and the second test pulse signal as a clock signal for an activation duration of the first test control signal, shift a level of a power supply voltage, and activate the test result signal; and a transmitter/receiver configured to receive the first test pulse signal and the second test pulse signal from the via for the activation duration of the first test control signal.

11. The semiconductor integrated circuit according to claim 10, wherein the shift logic comprises:
A first flip-flop and a second flip-flop configured for sequentially shifting a level of the power supply voltage.

12. The semiconductor integrated circuit according to claim 9, wherein the lowermost semiconductor chip is a master chip.

13. The semiconductor integrated circuit according to claim 9, wherein all the semiconductor chips, except for the lowermost semiconductor chip, are slave chips.

14. A semiconductor integrated circuit including a plurality of semiconductor chips coupled to one another through vias, wherein a lowermost semiconductor chip of the plurality of semiconductor chips is configured to generate a first test pulse signal and transmit the first test pulse signal through the via,
an uppermost semiconductor chip of the plurality of semiconductor chips is configured to generate a second test pulse signal while substantially maintaining a time difference with the first test pulse signal, and to transmit the second test pulse signal through the via,
the plurality of semiconductor chips are configured to receive the first test pulse signal and the second test pulse signal, generate test result signals for determining whether the vias are defective in response to the first test pulse signal and the second test pulse signal, and to change signal paths, which are coupled to defective vias, to repair vias in response to the test result signals.

15. The semiconductor integrated circuit according to claim 14, wherein the lowermost semiconductor chip comprises:
a transmission/reception unit configured to have a signal path set in response to a selection signal, transmit an internal signal to the via or receive a signal transmitted through the via;
a test unit configured to generate the first test pulse signal at a first timing, and generate the test result signal in response to the first test pulse signal and the second test pulse signal; and
a repair unit configured to change the selection signal in response to the test result signal.

16. The semiconductor integrated circuit according to claim 14, wherein the lowermost semiconductor chip further comprises:
a test control signal generation unit configured to generate first to third test control signals for controlling generation timings of the first test pulse signal and the test result signal.

17. The semiconductor integrated circuit according to claim 16, wherein the test unit comprises:
a shift logic configured to receive the first test pulse signal and the second test pulse signal as a clock signal for an activation duration of the first test control signal, shift a level of a power supply voltage, and activate the test result signal;
a pulse generator configured to generate the first test pulse signal in response to the second test control signal; and
a transmitter/receiver configured to transmit the first test pulse signal to the via for an activation duration of the second test control signal, and receive the second test pulse signal from the via for an activation duration of the third test control signal.

18. The semiconductor integrated circuit according to claim 17, wherein the shift logic comprises:
A first flip-flop and a second flip-flop configured for sequentially shifting a level of the power supply voltage.

19. The semiconductor integrated circuit according to claim 16, wherein the uppermost semiconductor chip comprises:
a transmission/reception unit configured to have a signal path set in response to a selection signal, transmit an internal signal to the via or receive a signal transmitted through the via;
a test unit configured to generate the second test pulse signal at a second timing, and generate the test result signal in response to the first test pulse signal and the second test pulse signal; and
a repair unit configured to change the selection signal in response to the test result signal.

20. The semiconductor integrated circuit according to claim 16, wherein the test unit comprises:
a shift logic configured to receive the first test pulse signal and the second test pulse signal as a clock signal for an activation duration of the first test control signal, shift a level of a power supply voltage, and activate the test result signal;
a pulse generator configured to generate the second test pulse signal in response to the third test control signal; and
a transmitter/receiver configured to receive the first test pulse signal from the via for an activation duration of the second test control signal, and transmit the second test pulse signal to the via for an activation duration of the third test control signal.

21. The semiconductor integrated circuit according to claim 20, wherein the shift logic comprises:
A first flip-flop and a second flip-flop configured for sequentially shifting a level of the power supply voltage.

22. The semiconductor integrated circuit according to claim 16, wherein each of remaining semiconductor chips, except for the is lowermost semiconductor chip and the uppermost semiconductor chip, comprises:
a transmission/reception unit configured to have a signal path set in response to a selection signal, transmit an internal signal to the via or receive a signal transmitted through the via;
a test unit configured to generate the test result signal in response to the first test pulse signal and the second test pulse signal; and
a repair unit configured to change the selection signal in response to the test result signal.

23. The semiconductor integrated circuit according to claim 22, wherein the test unit comprises:
a shift logic configured to receive the first test pulse signal and the second test pulse signal as a clock signal for an activation duration of the first test control signal, shift a level of a power supply voltage, and activate the test result signal; and
a transmitter/receiver configured to receive the first test pulse signal and the second test pulse signal from the via for the activation duration of the first test control signal.

24. The semiconductor integrated circuit according to claim 23, wherein the shift logic comprises:
A first flip-flop and a second flip-flop configured for sequentially shifting a level of the power supply voltage.

25. The semiconductor integrated circuit according to claim 16, wherein the plurality of vias include a plurality of dedicated vias that are used to transmit the first to third test control signals.

* * * * *